US008819518B2

(12) United States Patent
Stewart

(10) Patent No.: US 8,819,518 B2
(45) Date of Patent: Aug. 26, 2014

(54) APPARATUS AND METHOD FOR DECODING LOW DENSITY PARITY CHECK CODED SIGNALS

(75) Inventor: John Sidney Stewart, Indianapolis, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 1446 days.

(21) Appl. No.: 12/085,502

(22) PCT Filed: Dec. 1, 2005

(86) PCT No.: PCT/US2005/043586
§ 371 (c)(1),
(2), (4) Date: May 22, 2008

(87) PCT Pub. No.: WO2007/064325
PCT Pub. Date: Jun. 7, 2007

(65) Prior Publication Data
US 2009/0103636 A1    Apr. 23, 2009

(51) Int. Cl.
*H03M 13/00* (2006.01)
*H03M 13/11* (2006.01)
(52) U.S. Cl.
CPC ...... *H03M 13/6566* (2013.01); *H03M 13/1105* (2013.01); *H03M 13/1137* (2013.01)
USPC .......................................................... 714/758
(58) Field of Classification Search
CPC .................................................... H03M 13/00
USPC ................. 375/240.01, 240.27; 714/752, 758
IPC ..................................................... H04N 11/02
See application file for complete search history.

(56) References Cited

U.S. PATENT DOCUMENTS 7,299,397 B2    11/2007    Yokokawa et al.
7,318,186 B2    1/2008    Yokokawa et al.
(Continued)

FOREIGN PATENT DOCUMENTS

JP    2004343170    12/2004
JP    2004364233    12/2004
(Continued)

OTHER PUBLICATIONS

Chanho Lee, "Design of Encoder and Decoder for LDPC Codes Using Hybrid H-Matrix" ETRI Journal (Online) vol. 27, No. 5, Oct. 2005 XP002375415 Relevant to whole document, Figure 10, Claims 1-19.

(Continued)

*Primary Examiner* — Jay Patel
*Assistant Examiner* — Yulin Sun
(74) *Attorney, Agent, or Firm* — Robert D. Shedd; Vincent E. Duffy; Michael A. Pugel

(57) ABSTRACT

The disclosed embodiments relate to an apparatus and method for decoding signals in a receiver, such as signals using low density parity check error correction. The apparatus includes a link circuit. The link circuit may include a first memory, a first and second processing block, and also include a first shift circuit for shifting data before entering one of the processing blocks and a second shift circuit for reversing the first shift after exiting the processing block. The link circuit may also include a second memory used for intermediate storage and shared by the first and second processing block. The method includes reading data from a memory, shifting the data prior to processing, processing the data, and then reverse shifting the data prior to writing it back to the memory.

6 Claims, 4 Drawing Sheets

(56) References Cited

U.S. PATENT DOCUMENTS

| | | | |
|---|---|---|---|
| 2002/0129317 A1* | 9/2002 | Nicol et al. | 714/792 |
| 2003/0023917 A1 | 1/2003 | Richardson et al. | |
| 2005/0240853 A1* | 10/2005 | Yokokawa et al. | 714/752 |
| 2006/0005105 A1 | 1/2006 | Kenji-Yoshida | |
| 2006/0107181 A1* | 5/2006 | Dave et al. | 714/758 |
| 2008/0104474 A1 | 5/2008 | Gao et al. | |

FOREIGN PATENT DOCUMENTS

| | | |
|---|---|---|
| JP | 2005-065066 | 3/2005 |
| JP | 2006-019889 | 1/2006 |
| JP | 2008-515342 | 5/2008 |
| WO | WO 2004/077733 A | 9/2004 |

OTHER PUBLICATIONS

Search Report Dated Aug. 3, 2006.

Kim, et al, "Development of broadband satellite multimedia system for brodcasting and communication convergence", The Institute on Electronics, Mar. 1, 2005.

* cited by examiner

APPARATUS AND METHOD FOR DECODING LOW DENSITY PARITY CHECK CODED SIGNALS

FIELD OF THE INVENTION

The present invention relates generally toward a communications receiver. More specifically, the present invention relates to the processing of error correction signals in systems using methods such as low density parity check coding.

BACKGROUND OF THE INVENTION

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

As most people are aware, satellite television systems have become much more widespread over the past few years. In fact, since the introduction of digital satellite television in 1994, more than twelve million American homes have become satellite TV subscribers. Most of these subscribers live in single-family homes where satellite dishes are relatively easy to install and connect. For example, the satellite dish may be installed on the roof of the house. In order to continue this growth, the customer often expects more every year from the service. The service providers thus are constantly considering new features and upgrades such as recording, multi-room operation, and larger and better content. Recently, more attention has become focused on high definition video and audio signals.

High definition signals require more capacity or bandwidth than the services currently provided on the satellite system. Also, many high definition services are provided in addition to, rather than as a replacement to, the current service. In order to provide these new services, some service providers are increasing the total capacity of their systems. Capacity can be increased in a number of ways including increasing the number of transponders or satellite channels available or increasing the number of satellites used. The largest change to the satellite system involves changing the actual communications system specifications.

Recent advances in technology have allowed satellite service providers to consider increasing capacity by changing the system specifications in a number of ways including using a new decoding algorithm such as one created by the Motion Picture Entertainment Group (MPEG) commonly known as MPEG-4. Additionally, it is possible to utilize a more advanced modulation format such as eight level phase shift keying (8PSK) found in the standard created for digital video broadcast (DVB), known as DVB-S2. The DVB-S2 standard also provides for a new error correction system known as low density parity check (LDPC) coding, which allows a further increase in overall system capacity. Although these changes can increase capacity in the communications system, they also change the operating margins for receiving the signal and force changes in the receiver design.

Almost all communications systems, and particularly digital systems such as the satellite system described, employ some form of error correction method to improve receiver performance. These schemes can involve very complex functions that must be carried out at either the transmitter or receiver or both. As mentioned, one such scheme becoming prevalent is LDPC coding.

LDPC coding is a method of error correction that creates parity bits for small sections of a larger segment of a data stream, and appends these to the data stream. The data stream segment operated on may be quite large, for instance 64,800 bits, and parity bits may be created for much smaller sections, such as 3 bits in a group.

Although the processing is performed on segments of the data stream, the incoming data stream remains continuous. The incoming data stream is typically a video or audio signal in a digital form, so the processing must be completed in a finite amount of time. The time allotted for processing the data stream segment is typically referred to as the LDPC frame time. In addition, the parity groups may overlap, where a single bit may be a member of more than one parity group and therefore may have more than one parity bit responsible for the data bit's parity. The method of assigning these groups and parity bits is typically known and predetermined in order for the decoder, and in particular the controller for the decoder, to properly manage the parity checking process.

LDPC decoding may have several layers of processing complexity. A first and very simple parity operation can be performed on the data stream now containing the appended parity bits. The simple parity operation involves simply performing a conventional parity check based on the parity of the parity group and its associated parity bit. If an error is found, then it may be corrected based on the results of the parity group checking. However, it is possible that some errors remain uncorrectable because the exact bit that is in error may still be indeterminable. In order to further address performance of error correction, the same data bit is often used in more than one parity grouping.

Even with both simple parity and multiple group parity, all errors may still not be explicitly corrected. Additionally, due to the nature of the parity groupings, each bit contains not only information about its value intrinsically, but also extrinsically. The intrinsic information about the data bit may be characterized in terms of the actual value of the bit, including knowledge gained by performing parity check operations using the parity information. Extrinsic information involves information that can be determined about the value of the bit, based on values of other data bits in the data stream (e.g., data bits adjacent to the current data bit under process or other bits in the parity groupings.) Using both intrinsic and extrinsic information requires a more complex correction algorithm that involves using both elements of information in an iterative process in order to ascertain the final correct bit value.

The decoder for LDPC coding performs a series of iterations on the received data in order to remove errors from the received data. These iterations consist of two primary steps. The first is called the check node calculation, where data is read from a memory and some arithmetic operations are performed. The results are then written back into the memory. The circuit that performs this first operation is the check node processing unit (CPU). The second step is called the bit node calculation where other data is read from memory and additional arithmetic operations are performed. The results are again written back into memory. The circuit that performs this operation is called the bit node processing unit (BPU). Each of these processing units performs complex calculations that require both processing power and a large local register memory storage for intermediate results. Also, the result of one CPU operation is used in the next BPU operation and vice versa, so each processor is acting on the same data stream segment and only one processing block can operate at a time.

The LDPC codes are constructed so that many of these calculations can be done in parallel on a long segment of the incoming data stream. One current implementation consists of 360 parallel calculation block units processing a bit stream segment that is 64,800 bits long. As mentioned, an LDPC decoder utilizing this type of algorithm must be required to iterate through its process a number of times. Typically a decoder iterates between them as many as 50 or more times in order to determine the final error corrected values for incoming data. And as mentioned, a CPU operation and a BPU operation can never be done at the same time because the BPU operation may depend on changes made during the previous CPU operation and vice versa.

Each of the 360 blocks has the same or similar bit connections relative to each other. This similarity allows for a decoder architecture that permits 360 parallel calculation units. In order to decode the data, there is a circuit block that is responsible for getting 360 pieces of data for the calculation units. For each step, this data comes from a different set of locations in memory.

Although the performance of LDPC codes may exceed preceding error correction methods, the decoder required for an LDPC code is much larger than older systems and further requires multiple iterations through its processing path. The error correction performance is determined, and limited, by the number of iterations that can be made through the processing path in a given timeframe, the LDPC frame time. Structural limitations, including memory allocation, and memory access processing may place an overall restriction on performance of the decoder.

Increasing the number of iterations that can be performed in an LDPC frame time may directly result in improved decoder performance. A circuit architecture and method that increases the number of iterations that can be performed during an LDPC frame time are therefore desirable. Similarly it is desirable to provide an efficient use of resources, such as memory, when constructing the decoder in order to save both size and power, and also increase decoder performance.

SUMMARY OF THE INVENTION

The present invention is directed towards an error correction system in a communications receiver, and is further directed to an efficient apparatus and method for operating an error correction system, such as a low density parity check error correction system.

The apparatus of the present invention includes a main memory for storing data to be processed, a switch to selecting which of two processors receives data, a first processor for performing first processing on the data, a second processor, for performing second processing on the data and having a forward shift and a reverse shift operation to facilitate re-ordering of the data, and a controller for controlling the switching, shifting, and memory reading and writing functions.

The method of the present invention includes reading data from a first memory in an initial configuration, altering the configuration of the data, processing the altered data, returning the data back to the initial configuration, and storing the data back in the main memory.

BRIEF DESCRIPTION OF THE DRAWINGS

Advantages of the invention may become apparent upon reading the following detailed description and upon reference to the drawings in which.

The characteristics and advantages of the present invention may become more apparent from the following description, given by way of example.

DETAILED DESCRIPTION

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The following describes a circuit used for receiving satellite signals. Other systems utilized to receive other types of signals where the signal input may be supplied by some other means may include very similar structures. Those of ordinary skill in the art will appreciate that the embodiment of the circuits described herein is merely one potential embodiment. As such, in alternate embodiments, the components of the circuit may be rearranged or omitted, or additional components may be added. For example, with minor modifications, the circuits described may be configured to for use in non-satellite video and audio services such as those delivered from a cable network.

Figure 1:
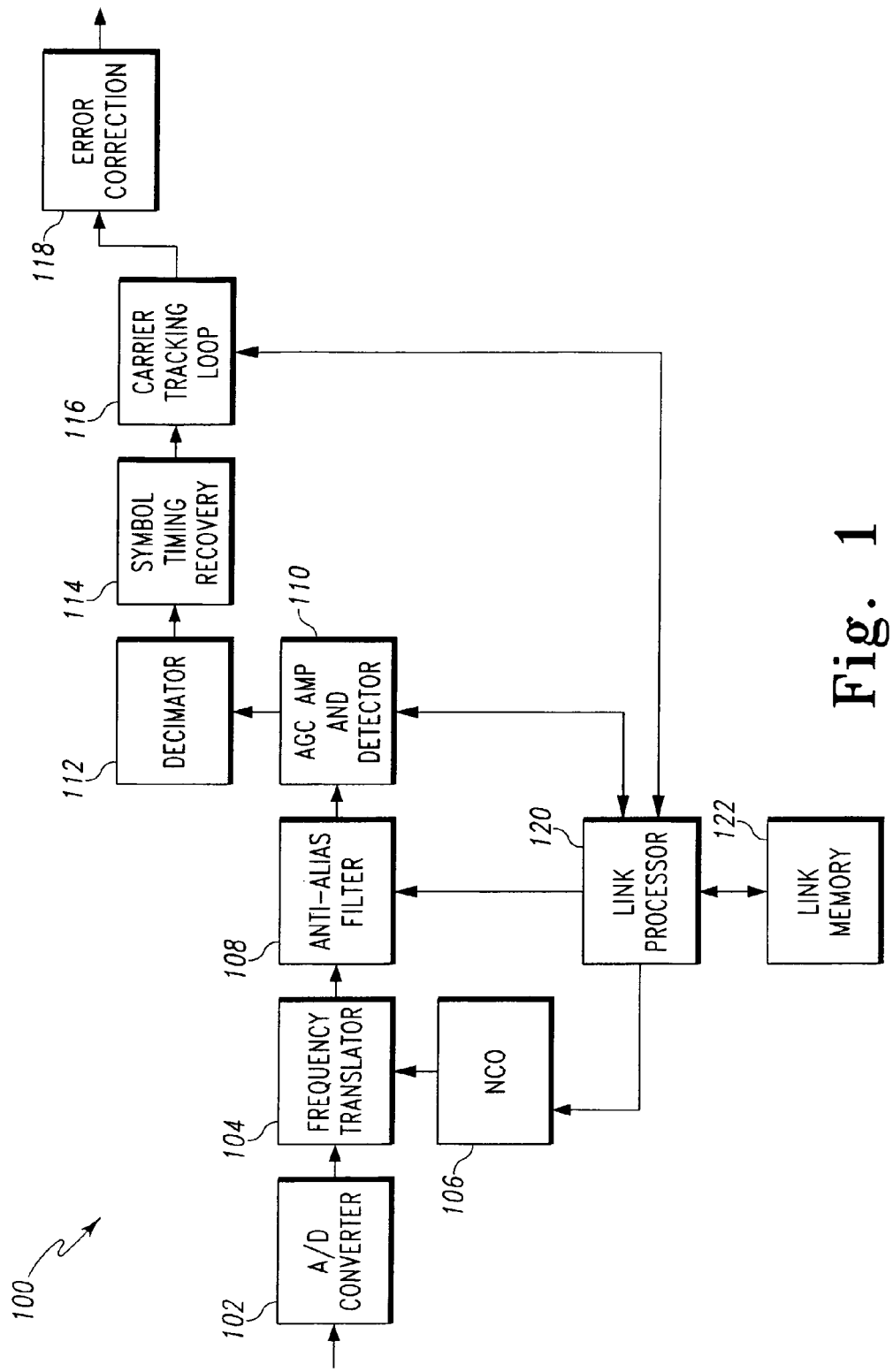
FIG. 1 is a block diagram of a link circuit of the present invention.

Turning now to FIG. 1, an exemplary link circuit 100 of the present invention is shown. At the input to the circuit, an analog to digital (A/D) converter 102 is connected to a frequency translator 104. An oscillator, such as a numerically controlled oscillator (NCO) 106, is also connected to the frequency translator 104. The output of the frequency translator 104 is connected to the anti-alias filter 108 and the anti-alias filter 108 is connected to the automatic gain control (AGC) amp block 110. The output of the AGC amp block 110 is connected to a decimator block 112 that is connected to the symbol timing recovery block 114. The symbol timing recovery block 114 is connected to a carrier tracking loop 116 and finally the carrier tracking loop block 116 is connected to the error correction block 118. A link processor 120 is connected to the NCO 106, the AGC amp block 110, the carrier tracking loop 116, and the link memory 122. For clarity, some connections and blocks may be omitted but one skilled in the art should recognize these omissions. The operation of each these blocks will be further described below.

The link circuit 100 contains an A/D converter 102 for converting the one or more baseband signals delivered from a tuner, not shown, into a digital signal. The digital signal from A/D converter 102 represents a series of samples of the one or more baseband signals, where each sample contains, for instance, a 10 bit word of data. It is important to note that the preferred embodiment utilizes one or more baseband signals as the inputs to the A/D converter 102. However, in another embodiment the signal(s) provided by the tuner as inputs to the A/D converter 102 may be located at a frequency that is near baseband, or may be located at some other intermediate frequency (IF).

A clock signal, not shown, is also connected to the A/D converter in order to produce the series of samples. The clock signal may be generated from another source such as a crystal and/or also may be further controlled by link processor 120. In one embodiment, the link processor 120 may determine the clock rate that is necessary for proper processing of the incoming received signal. In another embodiment, the sampling in the A/D converter 102 may be done at a fixed rate and processing, such as decimating the sampled signal down to the proper sampling rate, may be done in later blocks.

The digital signal from the A/D converter 102 is supplied to a frequency mixer or frequency translator 104. The frequency translator 104 also receives an input signal supplied from the NCO 106. The NCO 106 and frequency translator 104 are capable of shifting the incoming digital signal with respect to the incoming signal's carrier frequency, thereby producing a frequency shifted digital signal. The NCO 106 is typically a programmable frequency digital signal source. Control for programming the digital frequency of the NCO 106 may be generated by the link processor 120. In some embodiments, control may also be determined by the carrier tracking loop 116, described later, either in conjunction with the link processor 120 or separate from it. The operating range of the NCO 106 may be specified in terms of its frequency offset adjustment range. This range may be determined using a number of factors such as the incoming digital signal's symbol rate and/or the sampling rate the A/D converter 102 uses for processing the incoming baseband signal. In one embodiment, the frequency translator block 104 and NCO 106 allows a frequency offset, determined by the carrier tracking loop 116, to be removed directly in circuitry located in the link circuit 100. Correcting the offset within the link circuit 100 eliminates the possible re-tuning of the tuner, which may result in additional time delay that is undesirable to the user.

The output of the frequency translator 104 supplies the frequency shifted digital signal to the anti-alias filter 108. The anti-alias filter 108 is typically a digital filter that is used to remove signal energy not associated with the desired incoming signal while passing the desired incoming signal essentially unchanged. Depending upon the range of symbol rates of the input signals possible for demodulating in the link circuit 100, the anti-alias filter 108 may be a set of one or more fixed filters or a programmable filter. In a preferred embodiment, anti-alias filter 108 may be programmed to change its passband frequency response and/or other characteristics. In another embodiment, the filter may be programmed to match a passband characteristic of the incoming frequency shifted digital signal. One such passband characteristic may be signal bandwidth.

The filtered digital signal passes into the AGC amp block 110. The AGC amp block 110 contains a gain controllable digital signal amplifier and a signal detector. The signal detector is used to measure the magnitude of the signal that is present. The signal detector may typically detect the total power of the signal, such as the root mean square power, over a time period. The output of the signal detector is connected in a loop as a control signal for the gain controllable digital signal amplifier in a way that the output of the amplifier may be maintained at a constant level. In addition, the detector within the AGC block 110 may be used to provide an indication of the incoming signal level. One output of the detector, the level indicator signal, may be routed to the link processor 120 for further processing.

The AGC block 110 outputs a gain compensated signal from its controllable digital signal amplifier and supplies the gain compensated signal to a decimator 112. The decimator 112 reduces the effective sampling rate by removing samples of the gain compensated signal based on a comparison of the incoming signal sampling rate and the required sample rate for the symbol timing recovery block 114.

The symbol timing recovery block 114 contains a control loop that adjusts the phase of the incoming decimated signal in order to optimize the sampling position and allow optimal detection of the symbols of data sent in the incoming signal. The output of the symbol timing recovery block 114 then connects to a block containing the carrier tracking loop 116. The carrier tracking loop 116 contains a control loop that may determine and/or correct the phase and/or frequency of the incoming signal with respect to an expected or correct carrier frequency. The carrier tracking loop 116 may perform the determining and correcting of frequency offset without consideration for the actual values of the symbols of data in the incoming signal.

It is important to note that symbol timing recovery block 114 and carrier tracking loop 116 may be operatively coupled with respect to each other and/or to other blocks in the link circuit 100, as is well known to one skilled in the art.

The output of the carrier tracking loop 116, now a demodulated signal, enters the error correction block 118. Typically the error correction block 118 may contain a symbol slicer module for determining the actual symbol values. The error correction block 118 may also contain the symbol to bit mapper module used to generate the bits, containing data and error correction bits. Additionally, the error correction block 118 contains modules for utilizing the error correction information that has been sent along with the data in the incoming signal. A number of types of error correction methods may be employed in communications systems such as those described herein, as known to those skilled in the art. Some error correction methods may include Reed-Solomon error correction, trellis error correction, or Interleaving. Also, some newer types known as turbo code error correction and LDPC error correction may also be used. Any of these error correction methods may be used individually or may be combined to work together, as is known by those skilled in the art.

The following describes aspects of a newer type of error correction decoder, known as an LDPC decoder. The decoder may be found in a satellite receiver. Although the present invention is described as operating in an LDPC decoder, the present invention is not limited only to this particular decoder nor is the present invention limited to an LDPC decoder in a satellite receiver.

Figure 2:
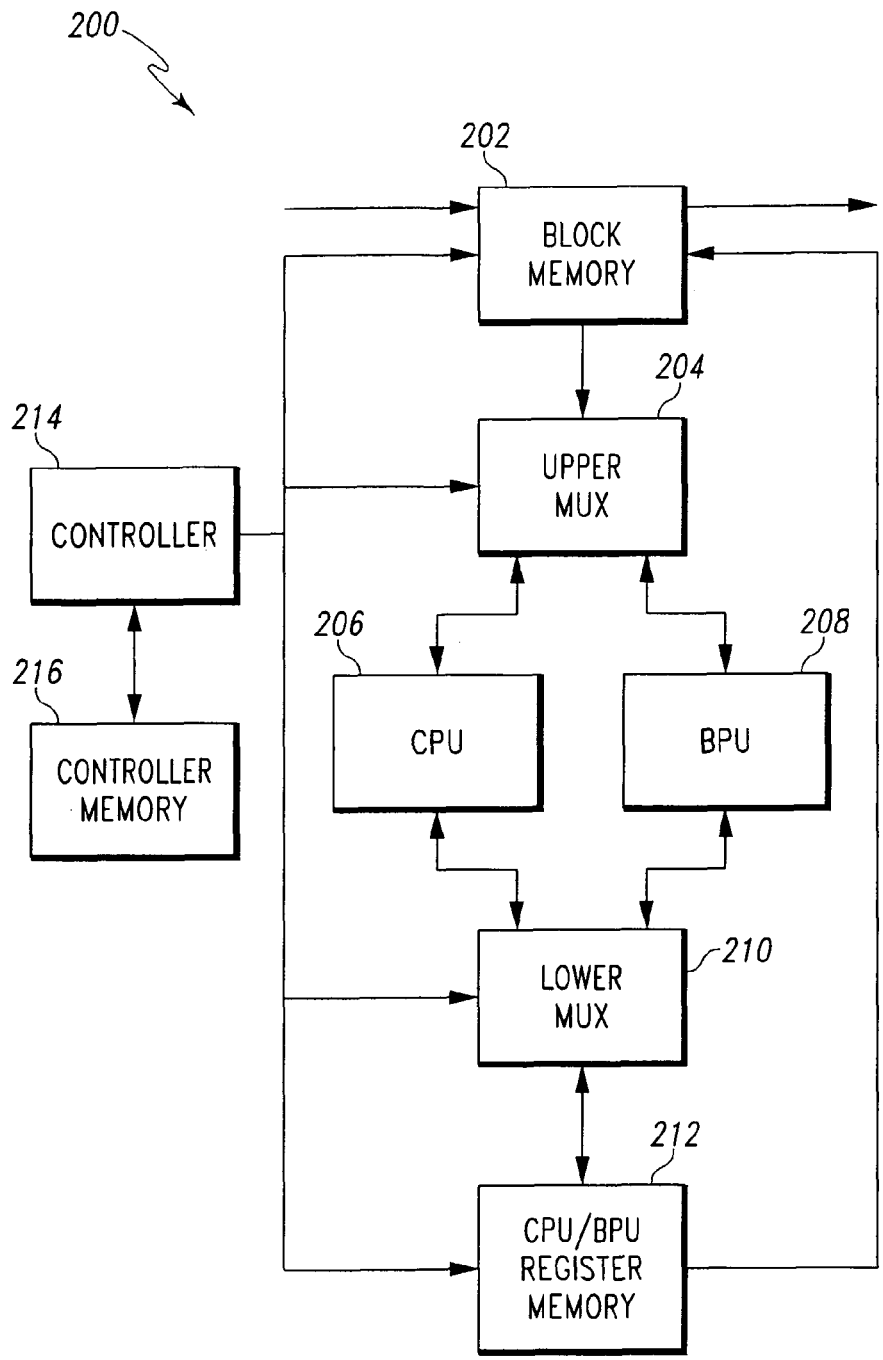
FIG. 2 is a block diagram of one aspect of the present invention.

Referring now to FIG. 2, a portion of one LDPC decoder block, 200, of the present invention is described. The LDPC decoder block 200 is located within the error correction block 118 shown in FIG. 1. It should be noted that FIG. 2 only shows one block unit of an entire LDPC decoder structure normally containing many identical blocks (e.g., as many as 360 identical blocks.) Each block operates in parallel on small sections of the data segment to process the entire data segment. For clarity, only the functional elements of the overall structure associated with the invention are illustrated.

A block memory 202 includes both input and output connections for connecting to other external processing blocks (i.e. carrier tracking loop and/or interleaver). The block memory 202 also connects to a multiplex switch, the upper mux 204. The upper mux 204, has two outputs, one connecting to a CPU block 206, and the other connecting to a BPU block 208. The CPU block 206 and BPU block 208 each connect to a second multiplex switch, the lower mux 210. The lower mux 210 connects to a CPU/BPU register memory 212. The CPU/BPU register memory 212 connects back to the block memory 202. A controller 214 is connected to the block memory 202, the upper mux, 204, the lower mux 210, the CPU/BPU register memory 212 and a controller memory 216.

The block memory 202 may be a Random Access Memory (RAM). The initial input into the block memory 202 may be a data segment containing, for example, demodulated data from the carrier tracking loop 116. The data segment contains data bits as well as error correction bits such as those used in LDPC error correction. Once the local error correction is complete, the output of the block memory 202 may contain a data stream segment representing an LDPC error corrected data stream with the error correction bits associated with LDPC error correction removed. The output of the block memory 202 may connect to another section of error correction, or it may connect to a video, audio, and/or data decoder.

The block memory 202 also supplies requested sections of the data segment to the CPU block 206 and BPU block 204 through upper mux 204. The upper mux 204 controls whether the section of the data segment is sent to the CPU block 206 or BPU block 208. The CPU block 206 and BPU block 208 are the main processors for processing the LDPC data and performing the error correction algorithm. As described earlier, these blocks operate separately from one another, with results of one processing step through BPU block 208 eventually entering the CPU block 206 and vice versa. Further, explanation regarding the actual algorithms employed by the CPU block 206 and BPU block 208 are beyond the scope of this invention but are well known to those skilled in the art.

The lower mux 210 may take the final processed output of the CPU block 206 or BPU block 208 and control which output is eventually routed back into the block memory 202. Both the CPU block 206 and BPU block 208 may require some local memory storage, such as a set of registers, for maintaining intermediate values during their internal algorithm processing steps. Typically, the memory will reside in each of the blocks 206 and 208, creating a duplicate set of memory dedicated to each processor. In the present invention, a CPU/BPU register memory 212 may be located beyond the multiplex switch 210 so that memory for the internal processing of the CPU block 206 and BPU block 208 may be shared by both the CPU block 206 and BPU block 208. As a result of sharing the memory space in the CPU/BPU register memory 212, a more efficient overall memory space utilization can be achieved. The sharing further may result in a reduction of total power and an increase of operating speed. The lower mux 210 acts as a bidirectional control switch for the flow of intermediate data values between the CPU/BPU register memory 212 and the one currently active processing block 206 or 208. After the active processing block, CPU block 206 or BPU block 208, has completed, the lower mux 210 then routes the final output of the active processing block back to the block memory 202 through the CPU/BPU register memory 212.

The controller 214 provides access control for both the block memory 202 and CPU/BPU register memory 212. The controller 212 determines which bits or sections of the incoming segment should be read from block memory 202 for processing in the currently processing cycle and/or which locations in block memory 202 to send the results of the current processing cycle. The CPU/BPU register memory 212 also receives access control and data directly from the CPU block 206 and BPU block 208. Additionally, the controller 214 provides control for the upper mux 204 and lower mux 210 based on the current processing mode.

The controller 214 utilizes the controller memory 216 to store the array locations for where the data stream elements are located in block memory 202. The array locations provide the proper sequence arrangements between the data bits, parity bits, and parity groups utilized within the CPU and BPU processing steps. Finally, all of the blocks operate using one or more clock signals, not shown. The clock signal(s) may be generated from a source external to the block unit, or generated internally. In one embodiment, the processing clock supplied to the block unit 200 and used by the BPU block 208 and CPU block 206, may be a signal generated as four times the frequency of the clock for the A/D converter 102.

Although the block memory 202, controller 212, and controller memory 216 are shown as part of the block unit in this embodiment, other embodiments may contain one block memory, one controller, and one controller memory for all the block units collectively. The functional description of the aforementioned blocks would not change. Additionally, a number of functions have not been included in the block diagram and are well known to one skilled in the art. The functions may include clock circuits, flag indicators, pipeline registers, and other control functions allowing, for instance, interconnection of information between block units.

Normally, the CPU and BPU functions operate more or less independently. The present invention combines some of the circuits, namely the register memory, used in the CPU and BPU calculation units, 206 and 208, to save circuitry. In particular, during the calculations done by the CPU and BPU units, 206 and 208, some intermediate results are stored in registers. The present invention uses a multiplexer, 210, to share these registers such that only one register memory, 212, is needed between both operations. A controller 214 is used to manage the sharing process.

The CPU block 206 may require the data to be processed in a manner different than in the BPU block 208. In one example, the CPU block 206 requires the data to be circular shifted with respect to a starting point in the data path. Conventionally, the shift is accomplished by using the CPU block 206 and requires three separate processes. A first process includes reading a data section out of block memory 202, shifting the data in the CPU block 206, and then sending the newly shifted data section back to the block memory 202. A second process includes reading this newly shifted data section from block memory 202 and sending the newly shifted data to the CPU block 206 for error correction processing. Once the CPU block processing is complete the processed shifted data is sent back to the block memory 202. Finally a third process includes reading the processed shifted data from the block memory 202, shifting the processed shifted data back (i.e., reversing the first shift) using the CPU block 206, and sending the newly unshifted processed data back to the block memory 202. After, the data in block memory 202 is now ready for processing using the BPU block 208. The three processes use extra clock cycles and therefore limit the number of iterations that can be accomplished within an LDPC frame time. Much greater efficiency in time can be achieved by providing the shift operations in series with the CPU block 306 as will now be described.

Figure 3:
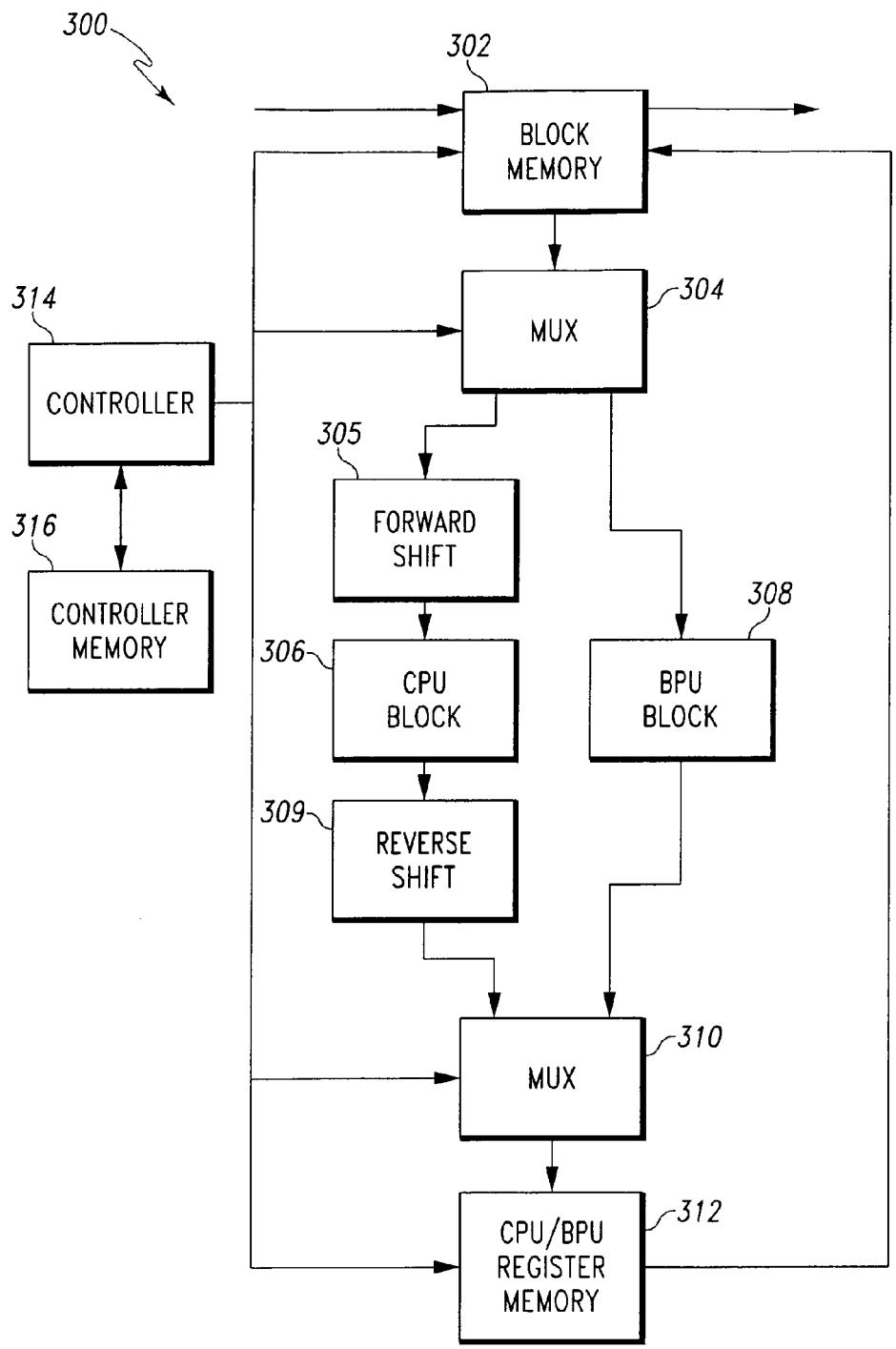
FIG. 3 is a block diagram of another aspect of the present invention.

Referring now to FIG. 3, a portion of one LDPC decoder block, 300, of the present invention is described. The LDPC decoder block 300 is located within the error correction block 118 shown in FIG. 1. It should be noted that FIG. 3 only shows one block unit of an entire LDPC decoder structure normally containing many identical blocks (e.g., as many as 360 identical blocks.) Each block operates in parallel on small sections of the data segment to process the entire data segment. For clarity, only the functional elements of the overall structure associated with the invention are illustrated.

A block memory 302 includes both input and output connections for connecting to other external processing blocks (i.e. carrier tracking loop and/or interleaver). The block memory 302 also connects to a multiplex switch, the upper mux 304. The upper mux 304 has two outputs, one connecting to a forward shift block 305 and the other connecting to the BPU block 308. The forward shift block 305 connects to the CPU block 306. The CPU block 306 connects to a reverse shift block 309, and along with BPU block 308, each connect to a second multiplex switch, the lower mux 310. The lower mux 310 connects to CPU/BPU register memory block 312. The CPU/BPU register memory block 312 connects back to the block memory 302. A controller 314 is connected to the block memory 302, the upper mux, 304, the lower mux 310, the forward shift block 305, the reverse shift block 309, and controller memory 316.

The block memory 302 may be a RAM. The initial input into the block memory 302 may be a data segment containing, for example, demodulated data from the carrier tracking loop 116. The data segment contains data as well as error correction bits such as those used in LDPC error correction. Once the local error correction is complete, the output of the block memory 302 may contain a data stream segment representing an LDPC error corrected data stream with the error correction bits associated with LDPC error correction removed. The output of the block memory 302 may connect to another section of error correction, or it may connect to a video/audio/data decoder.

The block memory 302 also supplies requested sections of the data segment to the CPU block 306 and BPU block 308 through upper mux 304. The upper mux 304 controls whether the section of the data segment is sent to the CPU block 306 or BPU block 308. The CPU block 306 and BPU block 308 are the main processors for processing the LDPC data and performing the error correction algorithm. As noted earlier, these blocks operate independently and also in series, with results of one BPU process output eventually entering the CPU block 306 and vice versa. Each of the CPU and BPU blocks may also utilize local memory for storing intermediate operations and calculations necessary to process the data stream. Further, explanation regarding the actual algorithms employed by the CPU block 306 and BPU block 308 are beyond the scope of this invention but are well known to those skilled in the art.

The data, after being read from block memory 302, is first shifted in the forward shift block 305 and then sent to the CPU block 306. After the CPU block 306 has completed the processing, another shift, reverse to the shift performed on the data before entering the CPU block 306, is performed in the reverse shift block 309. The shift and reverse shift functions permit data to be written back into memory in its proper orientation so that the data may be used by BPU block 308. Finally the lower mux 310 provides routing from the output of the BPU block 308, and the path containing the CPU block 306 and shift blocks 305 and 309 to the CPU/BPU register memory 312 and also back to the block memory 302. The CPU/BPU register memory 312 may be located beyond the multiplex switch 310 so that memory for the internal processing of the CPU block 306 and BPU block 308 may be shared by both the CPU block 306 and BPU block 308.

The controller 314 provides access control for both the block memory 302 and CPU/BPU register memory 312. The controller 314 determines which bits or sections of the incoming segment should be read from block memory 302 for processing in the currently processing cycle and/or which locations in block memory 302 to send the results of the current processing cycle. Additionally, the controller 314 provides control for the upper mux 304 and lower mux 310 based on the current processing mode. The controller 314 also provides control and data inputs for the forward shift block 305 and reverse shift block 309. In one embodiment, the controller 314 may provide control to the reverse shift block 309 as a control to bypass the reverse shift block during CPU processing, allowing the CPU block 306 to access the CPU/BPU register memory during intermediate CPU process operations.

The controller 314 utilizes the controller memory 316 to store the array locations for where the data stream elements are located in the block memory 302. The array locations provide the proper sequence arrangements between the data bits, parity bits, and parity groups utilized within the CPU and BPU processing steps. Additionally the controller memory 314 may contain the shift settings for each of the data segment sections. These shift settings are then used to program the shift blocks 305 and 309 that are located in the CPU processing path. Finally, all of the blocks operate using one or more clock signals not shown. The clock signal(s) may be generated from a source external to the block unit, or generated internally. In one embodiment, the processing clock supplied to the block unit and used by the BPU block 308 and CPU block 306, may be a signal generated as four times the frequency of the clock used for the A/D converter 102 in FIG. 1.

Although the block memory 302, controller 314, and controller memory 316 are shown as part of the block unit in this embodiment, other embodiments may contain one block memory, one controller, and one controller memory for all the block units collectively. The functional description of the aforementioned blocks would not change. Additionally a number of functions have not been included in the block diagram and are well known to one skilled in the art. The functions may include clock circuits, flag indicators, pipeline registers, and other control functions allowing, for instance, interconnection of information between block units.

As described earlier, performance of the LPDC error correction method is related to the number of iterations that the error correction block can perform on a data segment. The number of clock cycles available for processing is therefore very important. By utilizing a serial arrangement to implement the necessary shift operations within only the CPU processing path, a greater number of iterations in the error correction method may be achieved.

Figure 4:
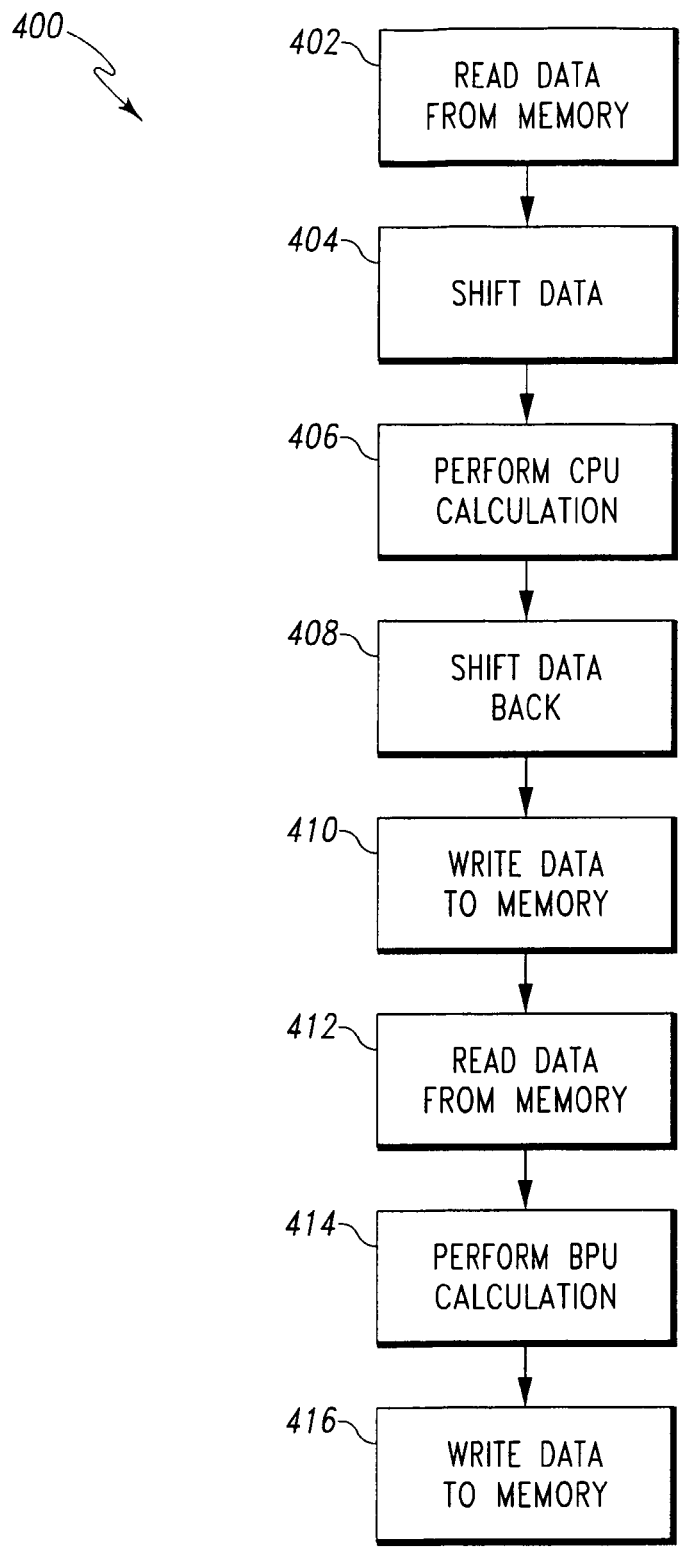
FIG. 4 is a flow chart of an exemplary method of one aspect of the present invention.

Referring now to FIG. 4, a flow chart, illustrating a method, 400, is shown. The flow chart describes a process first processing the data through the CPU path, followed by processing the data through the BPU path of the LDPC block in FIG. 3. In another embodiment, the process could begin with the BPU path and end with the CPU path. Also the process may continue through as many iterations as are needed to achieve the desired performance level or until the time frame for processing has ended.

First, at step 402, a section of data is read from the block memory 302. The data may then be passed towards the forward shift block 305 where, at step 404, the forward shift block 305 performs a shift of the data section. The shift in one preferred embodiment may be a circular shift of the section of data. Next, at step 406, calculations are performed in the CPU block 306. Once the calculations are complete in the CPU block 306, the processed data, at step 408, is reverse shifted in the reverse shift block 309. Next, at step 410, the data is written back into the block memory 302. At this step, the CPU processing for the iteration cycle has been completed.

Next, at step 412, the section of data is again read out of the block memory 302. The data is passed to the BPU block 308 where, at step 414, the BPU block 308 processes the data. Finally, at step 416, after completion of the processing in the BPU block 308, the data is written back into the block memory 302. At this point, one complete iteration through the process has been completed. As mentioned earlier, the process may iterate multiple times in order to improve performance of the decoder output.

As illustrated, each step in the process shown in FIG. 4 does not represent one cycle of the processing clock. In fact many steps may be combined onto the same clock cycle by using pipelining structures not illustrated but well known to one skilled in the art. For instance, the steps of reading a set of data, shifting a set of data, processing a set of data in the CPU block, and shifting a set of data back may occur simultaneously on the same clock cycle, given that each set of data is different and consecutive in processing sequence. In most instances, it is necessary that a memory read and write occur on different clock cycles.

The processing method and architectures permit an efficient approach to processing data in an LDPC decoder, allowing a maximal amount of process iterations within an LDPC frame time. Although aspects of the invention have been described separately, it is also possible and expected that the aspects can be combined to gain full advantage of the performance provided by each aspect of the invention.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method for performing error correction comprising the steps of: reading data from a first memory, said data being arranged in an initial configuration; forward shifting said data from the first memory, said forward shifting arranging said data in a second configuration; processing said forward shifted data using a first portion of an error correction process; reverse shifting said processed data, said reverse shifting returning said processed data from said second configuration to said initial configuration, said step of reverse shifting being by passed if said processed data is an intermediate result; writing said intermediate result into a second memory if said processed data is an intermediate result; and writing said reverse shifted data into said first memory if said processed data is not an intermediate result, wherein said reverse shifted data in said initial configuration is a configuration used for processing in a second portion of an error correction process and wherein said first memory receives a signal containing data bits and error correction bits from a carrier tracking loop and outputs a signal containing error corrected data bits to an interleaver and only stores data in said initial configuration.

2. The method of claim 1 further comprising: reading said written data from said first memory; processing said written data read from said first memory in the second portion of the error correction process; and writing said data processed in the second portion of the error correction process back into said first memory.

3. The method of claim 2, wherein said second portion of the error correction process is a bit node process.

4. The method of claim 1 wherein the method is used in an LDPC decoder.

5. The method of claim 1, wherein said first portion of the error correction process is a check node process.

6. An apparatus comprising: a means for reading data from a first memory, said data being arranged in an initial configuration; a means for forward shifting said data from the first memory, said means for forward shifting arranging said data in a second configuration; a means for processing said forward shifted data using a first portion of an error correction process; a means for reverse shifting said processed data, said means for reverse shifting returning said processed data from said second configuration to said initial configuration returning said first processed data to said initial configuration, said means for reverse shifting including a means for bypassing said reverse shifting if said processed data is an intermediate result; means for writing said intermediate result into a second memory if said processed data is an intermediate result; and a means for writing said reverse shifted data into said first memory if said processed data is not an intermediate result, wherein said reverse shifted data in said initial configuration is a configuration used for processing in a second portion of an error correction process and wherein said first memory receives a signal containing data bits and error correction bits from a carrier tracking loop and outputs a signal containing error corrected data bits to an interleaver and only stores data in said initial configuration.

* * * * *